(12) United States Patent
Bae et al.

(10) Patent No.: US 7,977,963 B2
(45) Date of Patent: Jul. 12, 2011

(54) METHODS, SYSTEMS AND APPARATUS FOR DETECTING ABNORMAL OPERATION OF AN INVERTER SUB-MODULE

(75) Inventors: Bon Ho Bae, Torrance, CA (US); Leah Dunbar, Manhattan Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 167 days.

(21) Appl. No.: 12/506,760

(22) Filed: Jul. 21, 2009

(65) Prior Publication Data

US 2011/0018578 A1 Jan. 27, 2011

(51) Int. Cl.
*G01R 31/40* (2006.01)
(52) U.S. Cl. .................................. 324/764.01
(58) Field of Classification Search .............. 324/764.01
See application file for complete search history.

(56) References Cited

U.S. PATENT DOCUMENTS 6,320,349 B1 * 11/2001 Kaneko et al. ............... 318/798
7,525,269 B2 * 4/2009 Patel et al. .................... 318/432

* cited by examiner

*Primary Examiner* — Ha Tran T Nguyen
*Assistant Examiner* — Tung X Nguyen
(74) *Attorney, Agent, or Firm* — Ingrassia Fisher & Lorenz, P.C.

(57) ABSTRACT

Methods and apparatus are provided for determining whether one or more inverter sub-modules of an inverter module is operating properly. Amplitude of each stator current signal is regularly measured. For each current signal, a positive counter counts a number of consecutive times the amplitude of that current signal is less than a positive current threshold, while a negative counter counts a number of consecutive times the amplitude of that current signal is greater than a negative current threshold. If the positive counter or the negative counter exceeds a maximum count, it is determined that an inverter sub-module is operating abnormally.

21 Claims, 5 Drawing Sheets

METHODS, SYSTEMS AND APPARATUS FOR DETECTING ABNORMAL OPERATION OF AN INVERTER SUB-MODULE

TECHNICAL FIELD

The present invention generally relates to hybrid and electric vehicle power systems, and more particularly relates to detecting abnormal operation of a three-phase PWM inverter module that is part of a hybrid and electric vehicle power system.

BACKGROUND OF THE INVENTION

Hybrid and electric vehicles (HEVs) typically include an alternating current (AC) electric motor which is driven by a direct current (DC) power source, such as a storage battery. Motor windings of the AC electric motor can be coupled to power inverter module(s) which perform a rapid switching function to convert the DC power to AC power which drives the AC electric motor, which in turn drives a shaft of HEV's drivetrain. Traditional HEVs implement two three-phase pulse width modulated (PWM) inverter modules and two three-phase AC motors each being driven by a corresponding one of the three-phase PWM inverter modules that it is coupled to. Each three-phase PWM inverter module generates three-phase currents (I_as, I_bs, I_cs) that drive one of the three-phase AC motors that the particular three-phase PWM inverter module is connected to. In particular, each three-phase PWM inverter module includes three inverter sub-modules, where each of the inverter sub-modules generates one of the three-phase currents (I_as, I_bs, I_cs) that is provided to a motor winding of the AC motor driven by that the three-phase PWM inverter module.

In some situations, a connection between the inverter module and its corresponding three-phase AC motor can fail. This can happen, for example, due to a disconnection of a wire to/in the three-phase AC motor.

An existing diagnostic method can detect an open circuit condition involving the three-phase PWM inverter module only if at least one of the three-phase currents (I_as, I_bs, I_cs) output by one of inverter sub-modules is zero when a current command is above a threshold. Thus, this diagnostic method works only when one (or more) of the inverter sub-modules does not generate a three-phase current (i.e., its output three-phase current has a value of zero).

Accordingly, it is desirable to provide other diagnostic methods, systems and apparatus for detecting abnormal operation of a three-phase PWM inverter module. Furthermore, other desirable features and characteristics of the present invention will become apparent from the subsequent detailed description and the appended claims, taken in conjunction with the accompanying drawings and the foregoing technical field and background.

SUMMARY OF THE INVENTION

Embodiments of the present invention relate to apparatus for detecting faulty operation of an inverter sub-module in an inverter module that is part of a hybrid and electric vehicle power system.

In one embodiment, a system and method are provided for determining whether a first inverter sub-module of an inverter module is operating normally. In accordance with this system and method, a plurality of sectors of a first current command signal are defined based on a phase angle of the first current command signal. The plurality of sectors include a first positive sector in which an amplitude of the first current command signal has positive values, and a first negative sector in which the amplitude of the first current command signal has negative values. In this system and method, a positive counter is maintained that counts a number of consecutive times the amplitude of a first current signal is determined to be less than a positive current threshold when the phase angle of the first current command signal is within the first positive sector. Amplitude of the first current signal is regularly measured, and after each measurement it is determined whether a present value maintained by the positive counter exceeds a first maximum count. When the present value maintained by the positive counter exceeds the first maximum count it is determined that the first inverter sub-module is operating abnormally. Likewise, a negative counter is also maintained that counts a number of consecutive times the amplitude of a first current signal is determined to be greater than a negative current threshold when the phase angle of the first current command signal is within the first negative sector. Amplitude of the first current signal is regularly measured, and after each measurement it is determined whether a present value maintained by the negative counter exceeds a second maximum count. When the present value maintained by the negative counter exceeds the second maximum count it is determined that the first inverter sub-module is operating abnormally.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

As used herein, the word "exemplary" means "serving as an example, instance, or illustration." The following detailed description is merely exemplary in nature and is not intended to limit the invention or the application and uses of the invention. Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary or the following detailed description.

Before describing in detail embodiments that are in accordance with the present invention, it should be observed that the embodiments reside primarily in combinations of method steps and apparatus components related to detecting faulty operation of a switch in a three-phase PWM inverter module that is part of a hybrid and electric vehicle power system. It will be appreciated that embodiments of the invention described herein can be implemented using hardware, software or a combination thereof. The control circuits described herein may comprise various components, modules, circuits and other logic which can be implemented using a combination of analog and/or digital circuits, discrete or integrated analog or digital electronic circuits or combinations thereof. As used herein the term "module" refers to a device, a circuit, an electrical component, and/or a software based component for performing a task. In some implementations, the control circuits described herein can be implemented using one or more application specific integrated circuits (ASICs), one or more microprocessors, and/or one or more digital signal processor (DSP) based circuits when implementing part or all of the control logic in such circuits. It will be appreciated that embodiments of the invention described herein may be comprised of one or more conventional processors and unique stored program instructions that control the one or more processors to implement, in conjunction with certain non-processor circuits, some, most, or all of the functions for detecting faulty operation of a switch in a three-phase PWM inverter module that is part of a hybrid and electric vehicle power system, as described herein. As such, these functions may be interpreted as steps of a method for detecting faulty operation of a switch in a three-phase PWM inverter module that is part of a hybrid and electric vehicle power system. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

OVERVIEW

Embodiments of the present invention relate to methods and apparatus for detecting faulty operation of a switch in a three-phase PWM inverter module that is part of a hybrid and electric vehicle power system. The disclosed methods and apparatus can be implemented in operating environments where it is necessary to detect faulty operation of a switch in a three-phase PWM inverter module that is part of a hybrid and electric vehicle power system. In the exemplary implementations which will now be described, the control techniques and technologies will be described as applied to a hybrid/electric vehicle (HEV). However, it will be appreciated by those skilled in the art that the same or similar techniques and technologies can be applied in the context of other systems which it is necessary to detect faulty operation of a switch in a three-phase PWM inverter module. In this regard, any of the concepts disclosed here can be applied generally to "vehicles," and as used herein, the term "vehicle" broadly refers to a non-living transport mechanism having an AC motor. Examples of such vehicles include automobiles such as buses, cars, trucks, sport utility vehicles, vans, vehicles that do not travel on land such as mechanical water vehicles including watercraft, hovercraft, sailcraft, boats and ships, mechanical under water vehicles including submarines, mechanical air vehicles including aircraft and spacecraft, mechanical rail vehicles such as trains, trams and trolleys, etc. In addition, the term "vehicle" is not limited by any specific propulsion technology such as gasoline or diesel fuel. Rather, vehicles also include hybrid vehicles, battery electric vehicles, hydrogen vehicles, and vehicles which operate using various other alternative fuels.

EXEMPLARY IMPLEMENTATIONS

Figure 1:
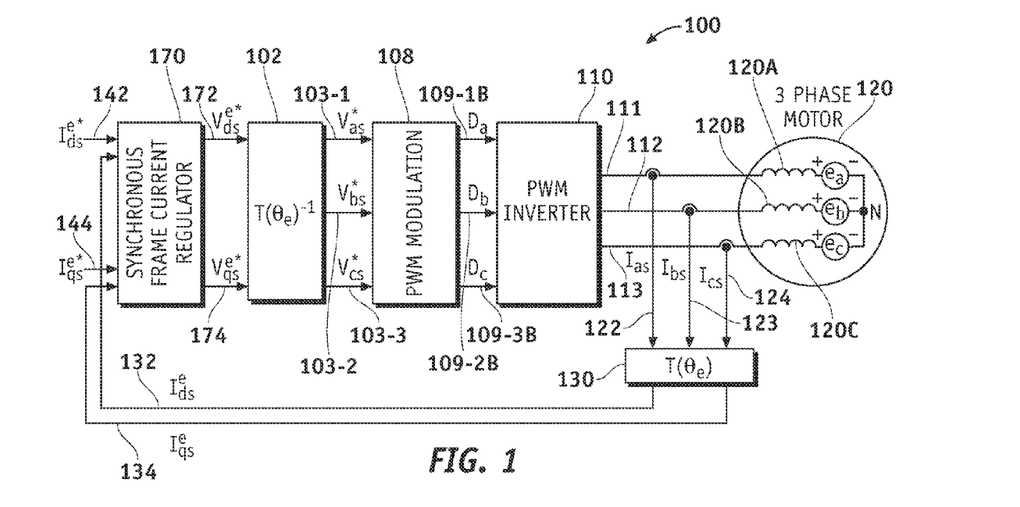
FIG. 1 illustrates a simplified block diagram of a three-phase motor drive system architecture that can be implemented in a hybrid/electric vehicle (HEV)

FIG. 1 illustrates a simplified block diagram of a three-phase motor drive system 100 architecture that can be implemented in a hybrid/electric vehicle (HEV). In this embodiment, the system 100 can be used to control a three-phase AC motor 120 via a three-phase pulse width modulated (PWM) inverter module 110 connected to the three-phase AC motor 120 by adjusting current commands that control the three-phase AC motor 120.

As illustrated in FIG. 1, the system 100, the three-phase PWM inverter module 110, a three-phase AC motor 120 coupled to the three-phase PWM inverter module 110, a synchronous frame current regulator module 170 (that may include summing junctions and current controller module which are not illustrated) that receives the current commands 142, 144 from a torque-to-current mapping module (not illustrated), a synchronous-to-stationary conversion module 102, and the three-phase PWM inverter module 108, and a stationary-to-synchronous conversion module that provides actual currents 132, 134 to the synchronous frame current regulator module 170. Although not illustrated, the system can include other well-known modules and control loops depending on the particular implementation. Operation of the system 100 will now be described.

The stationary-to-synchronous conversion module 130 receives a first resultant stator current (I_as) 122, a second resultant stator current (I_bs) 123, and a third resultant stator current (I_cs) 124 that are generated by the three-phase PWM inverter module 108 from the three-phase AC motor 120. The stationary-to-synchronous conversion module 130 can use these stator currents 122-124 along with a synchronous frame angle $\theta_e$ to generate a feedback d-axis current signal (Ids_e) 132 and a feedback q-axis current signal (Iqs_e) 134. The angle for synchronous frame ($\theta_e$) can be calculated differently depending on the specific type of AC motor. For example, in a permanent magnet motor the synchronous frame angle ($\theta_e$) can be calculated based on the rotor position $\theta_m$, and motor pole-pair. In an induction motor, the synchronous frame angle ($\theta_e$) 121 can be calculated based on the rotor position $\theta_m$, the motor pole pair and slip frequency. The process of stationary-to-synchronous conversion is well-known in the art as dq transformation or Park's transformation and is illustrated in Equation (1) as follows;

$$\begin{bmatrix} i_{ds}^e \\ i_{qs}^e \end{bmatrix} = T(\theta_e) \begin{bmatrix} i_{as} \\ i_{bs} \\ i_{cs} \end{bmatrix} \qquad \text{Eq. (1)}$$

-continued $$= \frac{2}{3}\begin{bmatrix} \cos(\theta_e) & \cos\left(\theta_e - \frac{2}{3}\pi\right) & \cos\left(\theta_e + \frac{2}{3}\pi\right) \\ \sin(\theta_e) & \sin\left(\theta_e - \frac{2}{3}\pi\right) & \sin\left(\theta_e + \frac{2}{3}\pi\right) \end{bmatrix}\begin{bmatrix} i_{as} \\ i_{bs} \\ i_{cs} \end{bmatrix}$$

As will be appreciated by those skilled in the art, a torque-to-current mapping module (not illustrated) receives a torque command signal (Te*) from higher level controller such as speed controller, a speed (ω1) of the shaft being driven by the motor, and a DC input voltage (Vdc) as inputs and maps the torque command signal (Te*) to a d-axis current command signal (Ids_e*) 142 and a q-axis current command signal (Iqs_e*) 144. The synchronous frame current regulator 170 receives the d-axis current command signal (Ids_e*) 142, the q-axis current command signal (Iqs_e*) 144, the feedback d-axis current signal (Ids_e) 132 and the feedback q-axis current signal (Iqs_e) 134 and uses these signals to generate a d-axis voltage command signal (Vds_e*) 172 and a q-axis voltage command signal (Vqs_e*) 174. The process of current to voltage conversion is well-known in the art and for sake of brevity will not be described in detail.

The synchronous-to-stationary conversion module 102 receives the d-axis voltage command signal (Vds_e*) 172 and the q-axis voltage command signal (Vqs_e*) 174, and based on these signals, generates a three-phase sinusoidal voltage command (Vas_*) 103-1, a second three-phase sinusoidal voltage command (Vbs_*) 103-2, and a third three-phase sinusoidal voltage command (Vcs_*) 103-3 using Equation (2) below.

$$\begin{bmatrix} v_{as}^* \\ v_{bs}^* \\ v_{cs}^* \end{bmatrix} = T(\theta_e)^{-1}\begin{bmatrix} v_{ds}^{e*} \\ v_{qs}^{e*} \end{bmatrix}$$

$$= \begin{bmatrix} \cos(\theta_e) & -\sin(\theta_e) \\ \cos\left(\theta_e - \frac{2}{3}\pi\right) & -\sin\left(\theta_e - \frac{2}{3}\pi\right) \\ \cos\left(\theta_e + \frac{2}{3}\pi\right) & -\sin\left(\theta_e + \frac{2}{3}\pi\right) \end{bmatrix}\begin{bmatrix} v_{ds}^{e*} \\ v_{qs}^{e*} \end{bmatrix}$$

Equation (2)

The three-phase PWM inverter module 108 receives the first three-phase sinusoidal voltage command (Vas_*) 103-1, the second three-phase sinusoidal voltage command (Vbs_*) 103-2, and the third three-phase sinusoidal voltage command (Vcs_*) 103-3 from the synchronous-to-stationary conversion module 102, and generates a first switching duty signal (Da) 109-1, a second switching duty signal (Db) 109-2, and a third switching duty signal (Dc) 109-3. As will be appreciated by those skilled in the art, modulation can be used for the control of pulse width modulation (PWM). The particular PWM algorithm implemented in the three-phase PWM inverter module 108 can be any known PWM algorithm including PWM algorithms.

The three-phase PWM inverter module 110 receives a DC input voltage (Vdc) (e.g., from a DC power source such as a battery or batteries or other fuel cell) via a high voltage DC bus) and switching duty signals 109, and uses them to generate alternating current (AC) waveforms (three-phase sinusoidal voltage signals) that drive the three-phase AC motor 120 at varying speeds based on the DC input voltage (Vdc). In the particular embodiment, the three-phase PWM inverter module 110 receives a first switching duty signal (Da) 109-1, a second switching duty signal (Db) 109-2, and a third switching duty signal (Dc) 109-3. The three-phase PWM inverter module 110 includes a plurality of inverter poles including a first inverter pole 111 that generates a three-phase sinusoidal voltage (Vas), a second inverter pole 112 that generates a second three-phase sinusoidal voltage (Vbs), and a third inverter pole 113 that generates a third three-phase sinusoidal voltage (Vcs). The three-phase PWM inverter module 110 and operational details will be described more fully below with reference to FIG. 2.

The three-phase AC motor 120 is coupled to the three-phase PWM inverter module 110 via the first inverter pole 111, the second inverter pole 112 and the third inverter pole 113. The three-phase AC motor 120 generates alternating current (AC) waveforms based on the three-phase sinusoidal voltage (Vas), the second three-phase sinusoidal voltage (Vbs) and the third three-phase sinusoidal voltage (Vcs). The AC waveforms drive the three-phase AC motor 120 at varying speeds. As used herein, the term AC motor refers to an electric motor that is driven by an alternating current (AC). An AC motor includes an outside stationary stator having coils supplied with alternating current to produce a rotating magnetic field, and an inside rotor attached to the output shaft that is given a torque by the rotating field. Depending on the type of rotor used, AC motors can be classified as synchronous or asynchronous. A synchronous AC motor rotates exactly at the supply frequency or a sub-multiple of the supply frequency. The magnetic field on the rotor is either generated by current delivered through slip rings or by a permanent magnet. In implementations where the AC machine is a permanent magnet synchronous AC motor this should be understood to encompass Interior Permanent Magnet motors. By contrast, an asynchronous (or induction) AC motor turns slightly slower or faster than the supply frequency. The magnetic field on the rotor of this motor is created by an induced current. The three-phase AC motor 120 can be a three-phase AC-powered "wound" motor such as a permanent magnet synchronous motor with a stator wound into definite poles, a three-phase induction motor or a switched reluctance motor. Although not shown, the motor 120 is coupled to a drive shaft of an HEV.

Figure 2:
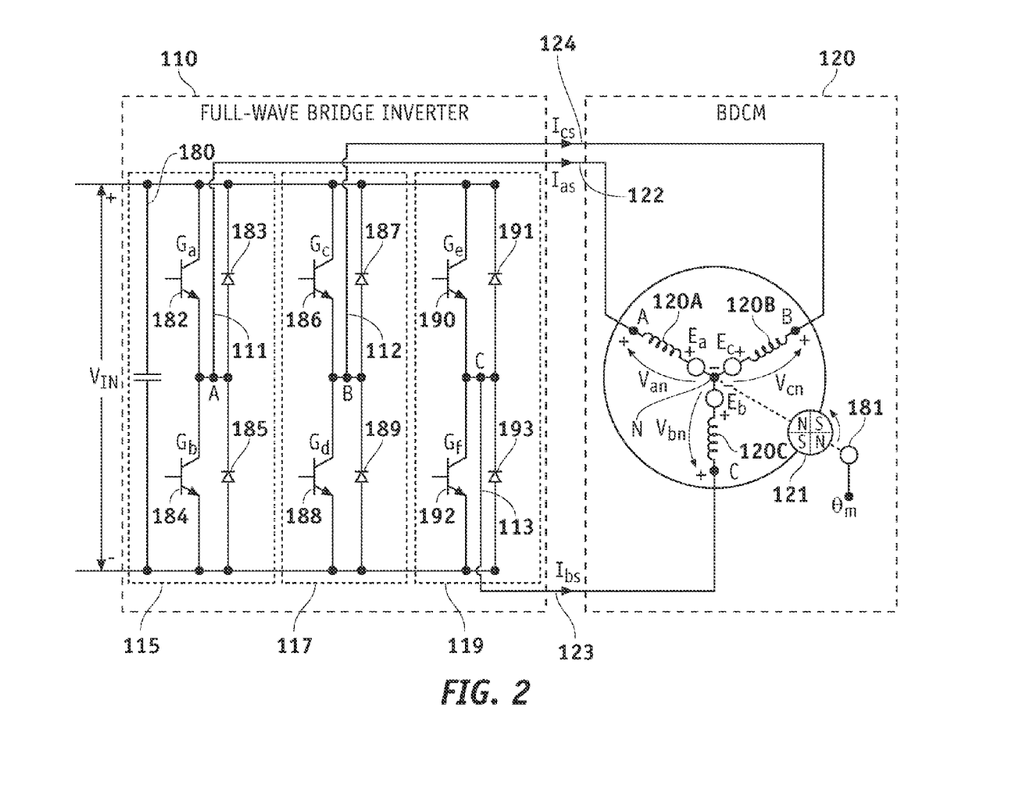
FIG. 2 is a simplified block diagram which illustrates portions of the hybrid electric vehicle (HEV) power system according to an exemplary implementation of the present invention.

FIG. 2 is a simplified block diagram which illustrates portions of the hybrid electric vehicle (HEV) power system 100 according to an exemplary implementation of the present invention. In the particular implementation illustrated in FIG. 2, the three-phase AC motor 120 can be referred to as a star-connected (or Y-connected) three-phase electric motor 120, and the three-phase PWM inverter module 110 can be referred to as a full-wave bridge inverter 110.

As illustrated in FIG. 2, the three-phase AC motor 120 has three motor windings 120A, 120B, 120C, and the three-phase PWM inverter module 110 includes a capacitor 180 and three inverter sub-modules 115, 117, 119. In this embodiment, inverter sub-module 115 is coupled to motor winding 120A, inverter sub-module 117 is coupled to motor winding 120B, and inverter sub-module 119 is coupled to motor winding 120C. The three-phase AC motor 120 includes three motor windings A, B, C (120A, 120B, 120C) that are coupled together at a neutral point. The current into motor winding A 120A flows out motor windings B 120B and C 120C, the current into motor winding B 120B flows out motor windings A 120A and C 120C, and the current into motor winding C 120C flows out motor windings A 120A and B 120B.

The star-connected three-phase motor 120 includes a rotor 121, and three stator windings 120A, 120B, and 120C connected in a wye-configuration between motor terminals A, B, and C. Phase currents (i.e., first resultant stator current (I_as) 122, second resultant stator current (I_bs) 123, and third resultant stator current (I_cs) 124) flow through respective stator windings 120A, 120B, and 120C. The phase to neutral voltages across each of the stator windings 120A-120C are respectively designated as $V_{an}$, $V_{bn}$, $V_{cn}$, with the back EMF voltages generated in each of the stator windings 120A-120C respectively shown as the voltages $E_a$, $E_b$, and $E_c$ produced by ideal voltage sources each respectively shown connected in series with stator windings 120A-120C. As is well known, these back EMF voltages $E_a$, $E_b$, and $E_c$ are the voltages induced in the respective stator windings 120A-120C by the rotation of rotor with flux. In the case of a permanent magnet motor, the flux is built up by permanent magnet. In the case of an induction motor, the rotor is built up by magnetization current in rotor. Although not shown, the motor 120 is coupled to a drive shaft. The motor 120 is also shown equipped with a rotor position sensor 181, which provides an output rotor position signal $\theta_m$ 121 representing the mechanical rotational angular position of rotor relative to the stator windings 120A-120C. Position sensor 181 can be a Hall Effect sensor, resolver or any other type position encoder known in the art.

The full-wave bridge inverter 110 includes a capacitor 180, a first inverter sub-module 115 comprising a dual switch 182/183, 184/185, a second inverter sub-module 117 comprising a dual switch 186/187, 188/189, and a third inverter sub-module 119 comprising a dual switch 190/191, 192/193. As such, full-wave bridge inverter 110 has six solid state switching devices 182, 184, 186, 188, 190, 192 and six diodes 183, 185, 187, 189, 191, 193 to appropriately switch compound voltage ($V_{IN}$) and provide three-phase energization of the stator windings 120A, 120B, 120C of the three-phase AC motor 120.

Although not illustrated, a closed loop motor controller can receive motor command signals and motor operating signals from the motor 120, and generate control signals for controlling the switching of solid state switching devices 182, 184, 186, 188, 190, 192 within the inverter sub-modules 115, 117, 119. By providing appropriate control signals to the individual inverter sub-modules 115, 117, 119, the closed loop motor controller controls switching of solid state switching devices 182, 184, 186, 188, 190, 192 within the inverter sub-modules 115, 117, 119 and thereby control the outputs of the inverter sub-modules 115, 117, 119 that are provided to motor windings 120A, 120B, 120C, respectively. The first resultant stator current (I_as) 122, the second resultant stator current (I_bs) 123, and the third resultant stator current (I_cs) 124 that are generated by the inverter sub-modules 115, 117, 119 of the three-phase PWM inverter module 110 are provided to motor windings 120A, 120B, 120C. The voltages as $V_{an}$, $V_{bn}$, $V_{cn}$, $E_a$, $E_b$, and $E_c$ and the voltage at node N fluctuate over time depending on the open/close state of switches 182, 184, 186, 188, 190, 192 in the inverter sub-modules 115, 117, 119 of the inverter module 110.

In some cases, the connection between the three-phase PWM inverter module 110 and the three-phase AC motor 120 can be "open." Such open-circuit situations can be due to a problem with a connector or cable between a pole 111-113 of the three-phase PWM inverter module 110 and a winding 120A-C of the motor, damage in one of the motor stator windings (120A . . . 120C), etc. Such open-circuit situations cause the improper current control of the three-phase AC motor 120. An existing open circuit diagnostic method can be used to determine or detect such open-circuit situations. In particular, the existing open circuit diagnostic method can be used to detect if any of the three-phase stator currents (I_as, I_bs, I_cs) 122-124 is zero or is very small current when a commanded current (Icmd) is higher than a certain value.

Although the existing diagnostic method works well for detecting an open circuit situations (e.g., cable disconnection or problem in motor winding), this method can not be used to detect other types of problems that can lead to improper current control of the three-phase AC motor 120, such as abnormal operation of one or more of the switches in the three-phase PWM inverter module 110. For example, the existing diagnostic method cannot detect a partial phase fault that happens when a switch (IGBT) in one of the inverter sub-modules 115, 117, 119 fails (so that only one of two switches is actually switching) or when a gate drive circuit (not illustrated) that generates gate (Ga . . . Gf) drive signals malfunctions. In these situations some three-phase stator current will flow and therefore the existing open circuit diagnostic method cannot detect these types of problems.

To explain further, as mentioned above, a three-phase PWM inverter module typically includes three inverter sub-modules, and each inverter sub-module includes a dual switching device. Each dual switching device includes two switches (e.g., a transistor or thyristor) that ideally operate in an alternating manner. In some cases at least one of switches (i.e., IGBT) may not switch properly (e.g., when one of the two switches fails). In this case, a three-phase current (I_as, I_bs, I_cs) 122-124 can still flow from that inverter sub-module. The particular inverter sub-module will produce a three-phase current that is only positive or is only negative and the amplitude of that particular three-phase current will greater than zero even though one of the switches in that inverter sub-module has failed or is not working properly. In other words, when only one of the switches does not switch, there will still be some current from that phase of the particular inverter sub-module. Because the three-phase currents will all still be greater than zero, the existing diagnostic methods for detecting abnormal operation of a three-phase PWM inverter module can fail in such a scenario and the malfunction will not be detected.

In accordance with one embodiment of the present invention, a diagnostic method is provided for detecting "abnormal operation" of a three-phase PWM inverter module, such as those used in a motor drive system, or in an AC/DC boost converter which is structurally identical. The diagnostic method can be used to detect abnormal operation of a three-phase PWM inverter module due to, for example: (1) a malfunction of the power electronics system (e.g., when one or more switching devices of the three-phase PWM inverter module is turned off due to problem in power electronics circuit), (2) a physical disconnection involving the three-phase PWM inverter module (e.g., when there is a physical disconnection between a wire/line/cable that connects a pole of the three-phase PWM inverter module to a motor winding of the motor), (3) a problem with an inverter connector, (4) damage to motor stator winding, or (5) a problem with a connection to a grid of a converter application, etc.

Figure 3:
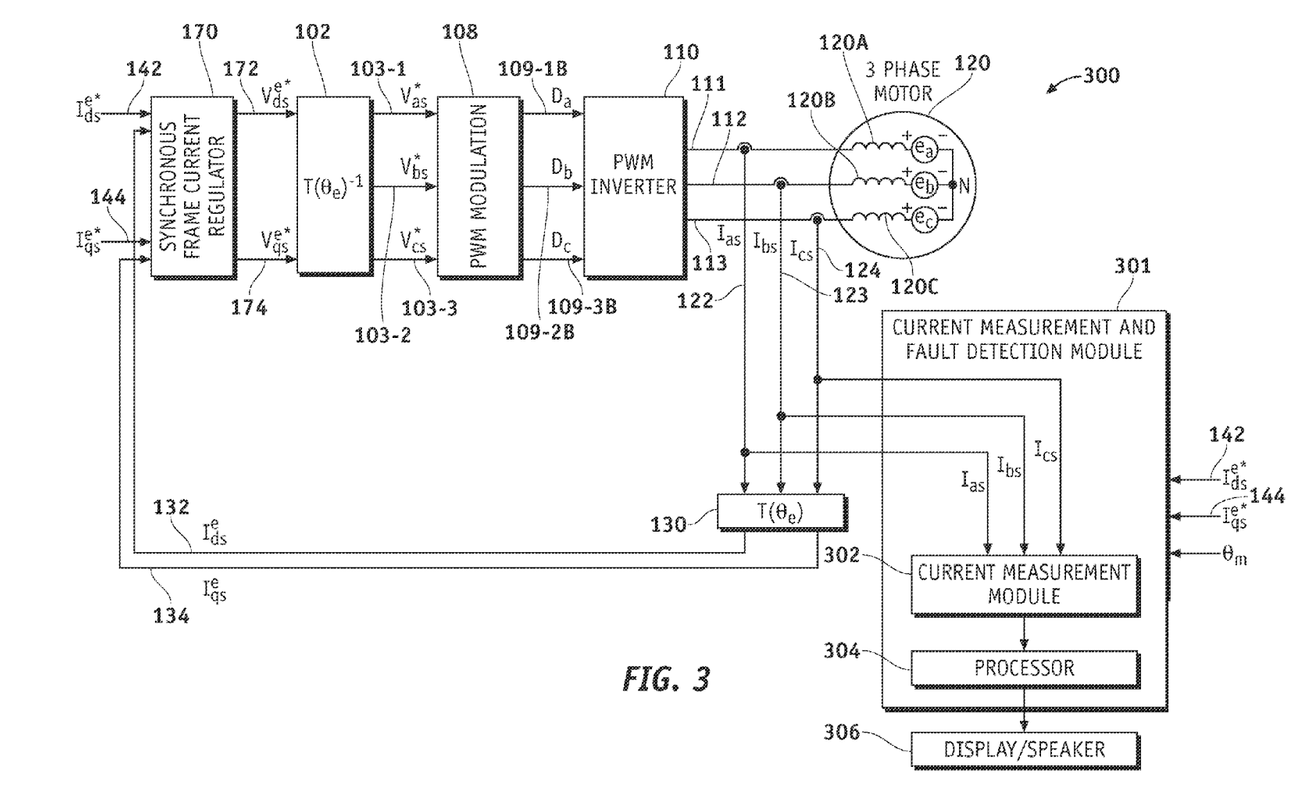
FIG. 3 illustrates a simplified block diagram of a three-phase motor drive system architecture implemented in a hybrid/electric vehicle (HEV) according to one exemplary implementation of the present invention.

FIG. 3 illustrates a simplified block diagram of a three-phase motor drive system 300 architecture implemented in a hybrid/electric vehicle (HEV) according to one exemplary implementation of the present invention. The system 300 includes many of the same blocks as in FIG. 1 and for sake of brevity these blocks will not be described again. In addition, the system includes a current measurement and fault detection module 301 and an output module 306, which can include for example a display and/or speaker used to indicate a detected fault.

The current measurement and fault detection module 301 comprises a current measurement module 302 that measures three-phase stator currents (I_as, I_bs, I_cs) 122-124 generated by the inverter sub-modules 115, 117, 119. The current measurement and fault detection module 301 also includes a fault detection module 304 that receives current measurements from the current measurement module 302 and processes them to determine whether the switches in each of the inverter sub-modules 115, 117, 119 of the inverter module 110 are operating correctly. In particular, the fault detection module 304 can detect an actual physical open circuit condition involving a three-phase PWM inverter module 110. This open circuit condition can be detected when: any of the three-phase currents (I_as . . . I_cs) 122-124 is zero or below a certain level when the amplitude of current command (that is input to current regulator 170) is above a threshold. In one implementation, the amplitude of the current command is computed using equation (1) as follows:

$$\sqrt{(i_{ds}^{e*})^2 + (i_{qs}^{e*})^2} \qquad \text{Equation (3)}$$

The fault detection module 304 can also detect abnormal operation of the three-phase PWM inverter module 110 when one or more of the six (6) switches 182, 184, 186, 188, 190, 192 in the three-phase PWM inverter module 110 are off or not operating properly. This can be characterized as a "malfunction of" or "abnormal operation of" the three-phase PWM inverter module 110. Abnormal operation of the three-phase PWM inverter module 110 is detected when any particular one of the three-phase stator currents (I_as, I_bs, I_cs) 122-124 is only positive or is only negative and the amplitude of a current command (that is input to current regulator 170) is above a threshold. Operation of the current measurement and fault detection module 301 will now be explained in greater detail with reference to FIG. 4.

Figure 4:
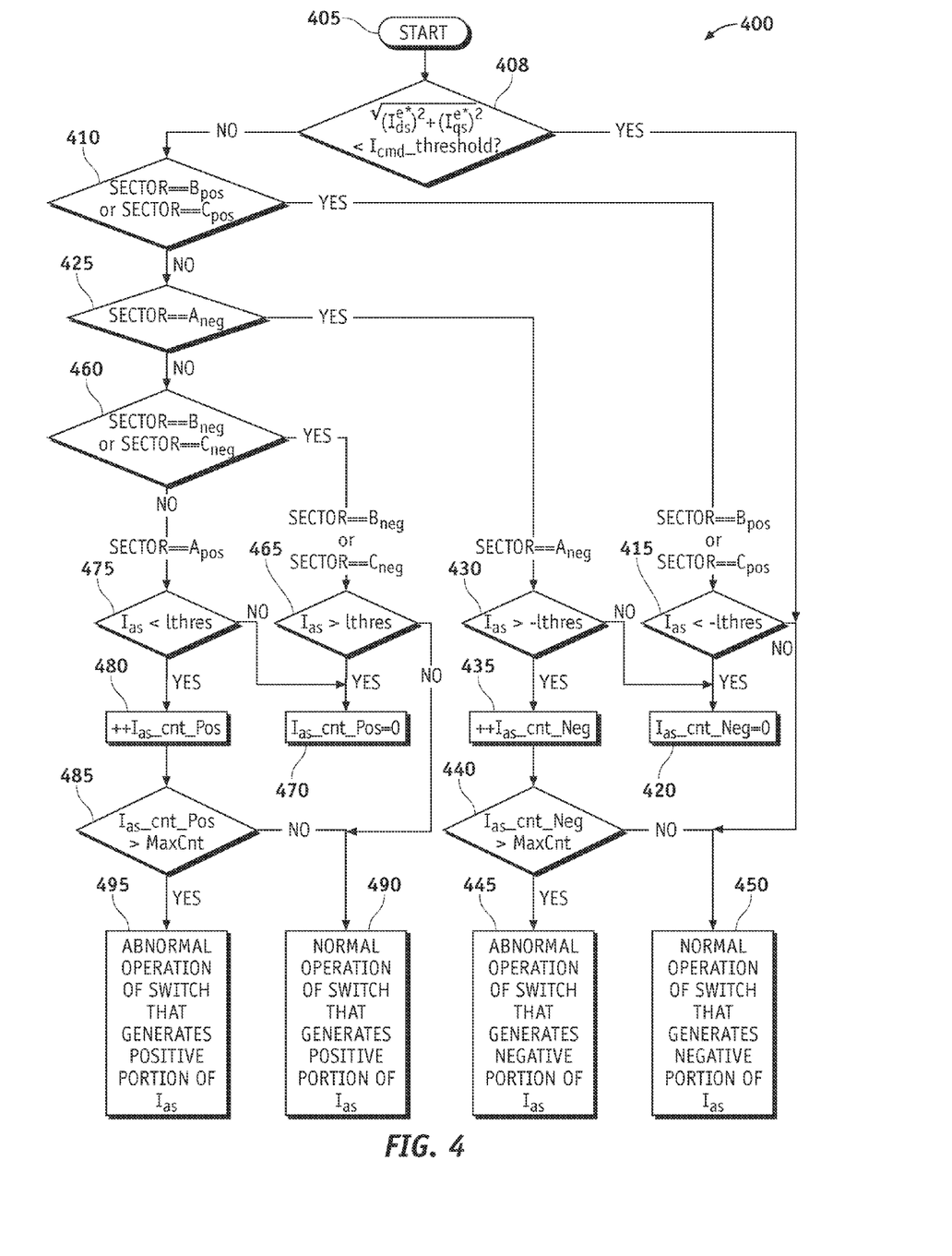
FIG. 4 is flow chart illustrating a method performed at a current measurement and fault detection module in accordance with some embodiments.

FIG. 4 is flow chart illustrating a method 400 performed at a current measurement and fault detection module 301 in accordance with some embodiments. Prior to describing method 400 a detailed explanation of various sectors that are defined in accordance with method 400 will be provided with reference to FIGS. 5 and 6.

Figure 5:
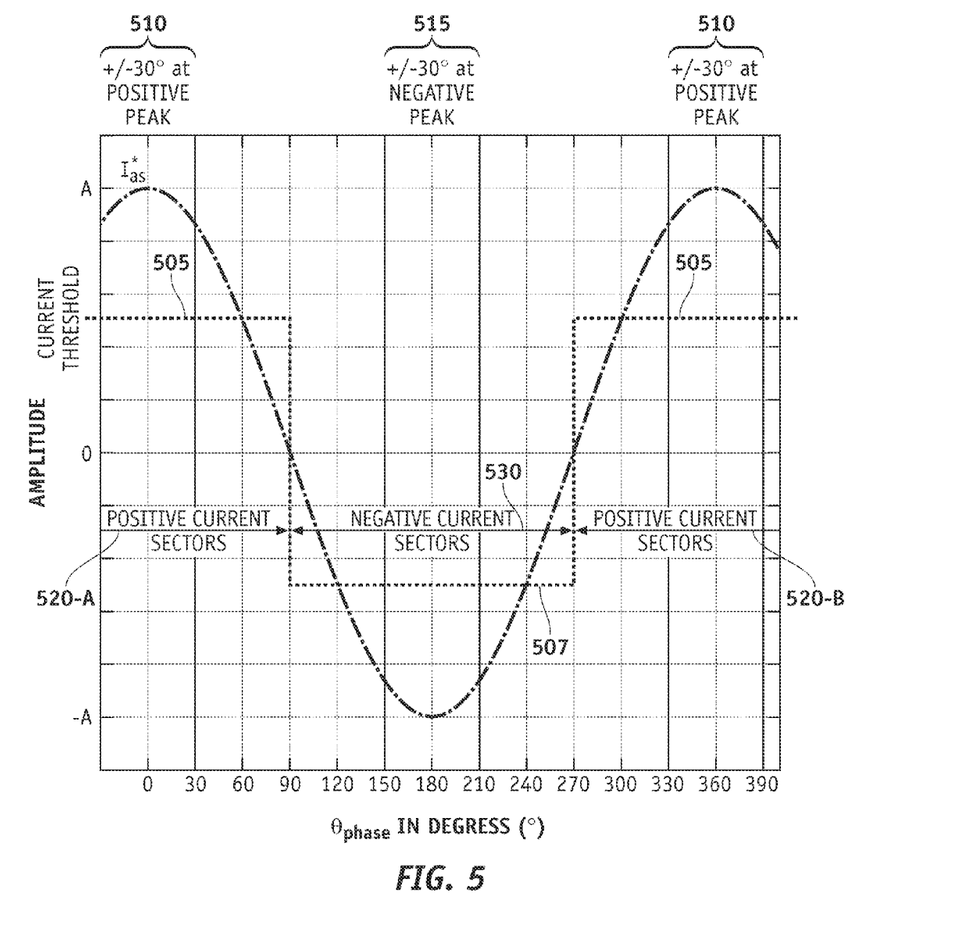
FIG. 5 is a graph of a three-phase stator current command signal (I_as*) in accordance with some embodiments.

FIG. 5 is a graph of a current command signal (I_as*) in accordance with some embodiments.

As illustrated in FIG. 5, the current command signal (I_as*) is a sinusoid having positive values 520-A, 520-B when the phase angle ($\theta_{phase}$) is between −90° and 90° and when the phase angle ($\theta_{phase}$) is between 270° and 90°, and having negative values 530 when the phase angle ($\theta_{phase}$) is between 90° and 270°. The current command signal (I_as*) has a positive peak amplitude (A) at 0° (or 360°) and a negative peak amplitude (−A) at 180°. In accordance with this embodiment, a positive sector (Apos) 510 and a negative sector (Aneg) 515 of the current command signal (I_as*) are defined. The positive sector (Apos) 510 of the current command signal (I_as*) is defined as values of the current command signal (I_as*) within ±30° of the positive peak amplitude (i.e., $\theta_{phase}$ values between −30° and +30° and between 330° and 390° and so on), and the negative sector (Aneg) 515 of the current command signal (I_as*) is defined as values of the current command signal (I_as*) within ±30° of the negative peak amplitude (i.e., $\theta_{phase}$ values between 150° and 210° and so on).

Figure 6:
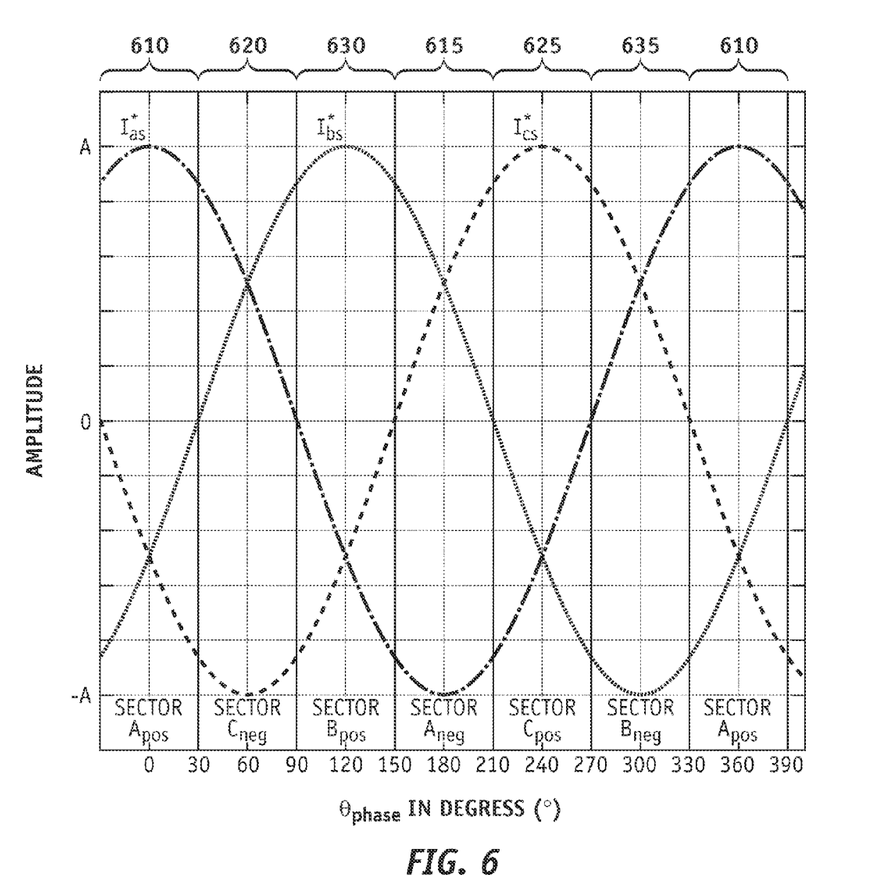
FIG. 6 is a graph of three-phase stator current command signals (I_as*, I_bs*, I_cs*) in accordance with some embodiments.

FIG. 6 is a graph of three-phase stator current command signals (I_as*, I_bs*, I_cs*) in accordance with some embodiments. The current command signals (I_as* . . . I_cs*) are not illustrated in FIG. 3 since they are computed in software based on the d-axis current command signal (Ids_e*) 142, the q-axis current command signal (Iqs_e*) 144 and the synchronous frame angle ($\theta_e$) using equations (4) and (5) as follows:

$$\begin{bmatrix} i_{as}^* \\ i_{bs}^* \\ i_{cs}^* \end{bmatrix} = T(\theta_e)^{-1} \begin{bmatrix} i_{ds}^{e*} \\ i_{qs}^{e*} \end{bmatrix} \qquad \text{Equation (4)}$$

$$= \begin{bmatrix} \cos(\theta_e) & -\sin(\theta_e) \\ \cos\left(\theta_e - \frac{2}{3}\pi\right) & -\sin\left(\theta_e - \frac{2}{3}\pi\right) \\ \cos\left(\theta_e + \frac{2}{3}\pi\right) & -\sin\left(\theta_e + \frac{2}{3}\pi\right) \end{bmatrix} \begin{bmatrix} i_{ds}^{e*} \\ i_{qs}^{e*} \end{bmatrix}.$$

$$\theta_{phase} = \theta_e + a\tan2(i_{qs}^{e*}, i_{ds}^{e*}) \qquad \text{Equation (5)}$$

The current command signal (I_as*) is a sinusoid having positive values when the phase angle ($\theta_{phase}$) is between −90° and 90° and when the phase angle ($\theta_{phase}$) is between 270° and 90°, and having negative values when the phase angle ($\theta_{phase}$) is between 90° and 270°. The current command signal (I_bs*) is a sinusoid having positive values when the phase angle ($\theta_{phase}$) is between 30° and 210°, and having negative values when the phase angle ($\theta_{phase}$) is between 210° and 30°. The current command signal (I_cs*) is a sinusoid having positive values when the phase angle ($\theta_{phase}$) is between 150° and 330°, and having negative values when the phase angle ($\theta_{phase}$) is between 330° and 150°. The three-phase current command signals (I_as* . . . I_cs*)) each have a positive peak amplitude (A) and a negative peak amplitude (−A). The current command signal (I_bs*) is phase-shifted by 120° with respect to the current command signal (I_as*) and the current command signal (I_cs*) is phase-shifted by 240° with respect to the current command signal (I_as*).

Positive and negative sectors can be defined for each of the current commands as follows: a positive sector (Apos) 610 of the current command signal (I_as*) is defined as values of the current command signal (I_as*) within ±30° of the positive peak amplitude at 0°, and a negative sector (Aneg) 615 of the current command signal (I_as*) is defined as values of the current command signal (I_as*) within ±30° of the negative peak amplitude at 180°; a positive sector (Bpos) 630 of the current command signal (I_bs*) is defined as values of the current command signal (I_bs*) within ±30° of the positive peak amplitude at 120°, and a negative sector (Bneg) 635 of the current command signal (I_bs*) is defined as values of the current command signal (I_bs*) within ±30° of the negative peak amplitude at 300°; and a positive sector (Cpos) 625 of the current command signal (I_cs*) is defined as values of the current command signal (I_cs*) within ±30° of the positive peak amplitude at 240°, and a negative sector (Cneg) 620 of the current command signal (I_cs*) is defined as values of the current command signal (I_cs*) within ±30° of the negative peak amplitude at 60°. Sectors are defined using current command signals (I_as* . . . I_cs*) instead of real actual three-phase stator currents (I_as . . . I_cs) 122-124 of the motor because the latter can have a lot of distortion and noise, which can cause sectors to change too frequently. Moreover, the phase angles ($\theta_{phase}$) of the current command signals (I_as* . . . I_cs*) sectors can be determined via a simple and quick calculation as described above in equation (5). The sectors can then be selected by the relationship between phase angle and sector as shown in FIG. 6, which will be described in greater detail below.

Method 400 will be described below with respect to processing performed using a single three-phase stator current command signal (I_as*) (not illustrated in FIG. 3) and a single three-phase stator current (I_as) 122 as will now be explained with reference to FIG. 5. However, it will be appreciated that method 400 can simultaneously be applied to any other number of three-phase stator currents (I_as ... I_cs) and their corresponding current commands (I_as* ... I_cs*). Method 400 will now be described with reference to FIGS. 5 and 6.

Method 400 starts at step 405, where the current measurement and fault detection module 301 computes a magnitude of the current command. The magnitude of the current command is equal to the root sum square of the d-axis current command signal (Ids_e*) 142 and the q-axis current command signal (Iqs_e*) 144. The root sum square of current command signals 142, 144 is computed by summing the squared values of the d-axis current command signal (Ids_e*) 142 and the q-axis current command signal (Iqs_e*) 144 and then computing the square root of the sum.

Method 400 should be enabled only when the magnitude of the current command is bigger than a current command threshold (Icmd_threshold) since this avoids a false indication of "abnormal switch operation." Thus, at step 408, the current measurement and fault detection module 301, determines whether the magnitude of the current command is less than a current command threshold (Icmd_threshold) as shown in equation (6), and if not the method 400 proceeds to step 410.

$$\sqrt{(i_{ds}^{e*})^2 + (i_{qs}^{e*})^2} < I_{cmd\_threshold} \quad \text{Equation (6)}$$

If the current measurement and fault detection module 301 determines that the magnitude of the current command is less than a current command threshold (Icmd_threshold), then the method proceeds to step 450, where the current measurement and fault detection module 301 determines that the inverter module 100 is operating normally. In general, "operating normally" as used here can mean that the inverter sub-module 115 is working properly (e.g., that the switches that generate the three-phase stator current (I_as) 122 are generating a current and operating normally), and that with respect to phase A there is cable connection between the inverter sub-module 115 and the phase A motor winding.

Prior to step 410, the current measurement and fault detection module 301 computes the phase angle ($\theta_{phase}$) of the three-phase stator current command signal (I_as*) using equation (5) above, and determines whether the phase angle ($\theta_{phase}$) of the three-phase stator current command signal (I_as*) is within the positive sector (Bpos) 630 or the positive sector (Cpos) 625.

Although not illustrated, the current measurement and fault detection module 301 also measures the magnitude of the three-phase stator current (I_as) 122, which it will use below at steps 415, 430, 465, 475.

When the current measurement and fault detection module 301 determines that the phase angle ($\theta_{phase}$) of the three-phase stator current command signal (I_as*) is within the positive sector (Bpos) 630 or the positive sector (Cpos) 625, then the method 400 proceeds to step 415, where the current measurement and fault detection module 301 determines whether the magnitude value of the three-phase stator current (I_as) 122 is less than a negative current threshold (-Ithresh) 507. It should be noted that the current command threshold (Icmd_threshold) is substantially larger in magnitude than the current threshold (-Ithresh) 507 (e.g., in one implementation if the current command threshold (Icmd_threshold) is twenty five Amperes the magnitude of the current threshold (Ithresh) 505 might be set to nine Amperes).

When the current measurement and fault detection module 301 determines that the amplitude value of the three-phase stator current (I_as) 122 is higher than a negative current threshold 507, then the method 400 proceeds to step 450, where the current measurement and fault detection module 301 determines that the switch 184 that generates the negative portion of the three-phase stator current (I_as) 122 is generating a current and is operating normally. By contrast, when the current measurement and fault detection module 301 determines that the value of the three-phase stator current (I_as) 122 is less than a negative current threshold 507, then the method proceeds to step 420 where the current measurement and fault detection module 301 resets a negative counter (Ias_cnt_Neg) that counts a number of consecutive times the amplitude value of the three-phase stator current (I_as) 122 is determined to be greater than a negative current threshold (-Ithresh) 507. As such, the negative counter (Ias_cnt_Neg) is reset only when the amplitude value of the three-phase stator current (I_as) 122 is less than the negative current threshold (-Ithresh) 507.

When the current measurement and fault detection module 301 determines (at step 410) that the phase angle ($\theta_{phase}$) of the three-phase stator current command signal (I_as*) is not within the positive sector (Bpos) 630 or the positive sector (Cpos) 625, then the method 400 proceeds to step 425, where the current measurement and fault detection module 301 determines whether the phase angle ($\theta_{phase}$) of the three-phase stator current command signal (I_as*) is within the negative sector (Aneg) 615. When the current measurement and fault detection module 301 determines that the phase angle ($\theta_{phase}$) of the three-phase stator current command signal (I_as*) is within the negative sector (Aneg) 615, the method 400 proceeds to step 430, where the current measurement and fault detection module 301 determines whether the amplitude value of the three-phase stator current (I_as) 122 is greater than the negative current threshold (-Ithresh) 507.

When the current measurement and fault detection module 301 determines (at step 430) that the amplitude value of the three-phase stator current (I_as) 122 is less than the negative current threshold (-Ithresh) 507, then the method proceeds to step 420 where the current measurement and fault detection module 301 resets the negative counter (Ias_cnt_Neg).

When the current measurement and fault detection module 301 determines that the amplitude value of the three-phase stator current (I_as) 122 is greater than the negative current threshold (-Ithresh) 507 (at step 430), then the method proceeds to step 435 where the current measurement and fault detection module 301 increments the negative counter (Ias_cnt_Neg) and the method proceeds to step 440. As such, the negative counter (Ias_cnt_Neg) is incremented only when the amplitude value of the three-phase stator current (I_as) 122 is greater than the negative current threshold (-Ithresh) 507.

At step 440, the current measurement and fault detection module 301 determines whether a present value of the negative counter (Ias_cnt_Neg) is greater than a maximum count (MaxCnt) value.

When the current measurement and fault detection module 301 determines that the present value of the negative counter (Ias_cnt_Neg) is not greater than the maximum count (MaxCnt) value, then the method 400 proceeds to step 450, where the current measurement and fault detection module 301 determines that the inverter sub-module 115 is operating normally (e.g., the switch 184 that generates the negative portion of the three-phase stator current (I_as) 122 is generating a current). By contrast, when the current measurement and fault detection module 301 determines that the present value of the negative counter (Ias_cnt_Neg) is greater than a maximum count (MaxCnt) value, then the method 400 proceeds to step 445, where the current measurement and fault detection module 301 determines that the operation of PWM inverter 110 is abnormal. The current measurement and fault detection module 301 does not make this determination until the negative counter (Ias_cnt_Neg) is greater than the maximum count (MaxCnt) value because in some scenarios the current could be very small even though the current command is relatively large for a short period due to, for example, noise or current controller issue. Therefore it is prudent to ensure that this condition happens for some time (corresponding to the maximum count (MaxCnt) value to avoid what could be a misleading indication that the operation of PWM inverter 110 is abnormal. The current measurement and fault detection module 301 can determine that the operation of PWM inverter 110 is abnormal for a variety of reasons such as (1) the switch 184 that generates the negative portion of the three-phase stator current (I_as) 122 is not operating properly (e.g., the switch 184 is not generating a current), (2) an open circuit in a wiring, connector or motor winding, etc.

At step 460, the current measurement and fault detection module 301 determines whether the phase angle ($\theta_{phase}$) of the three-phase stator current command signal (I_as*) is within the negative sector (Bneg) 635 or the negative sector (Cneg) 620. If so, then the method 400 proceeds to step 465, where the current measurement and fault detection module 301 determines whether the amplitude value of the three-phase stator current (I_as) 122 is greater than a positive current threshold (Ithresh) 505.

When the current measurement and fault detection module 301 determines that the amplitude value of the three-phase stator current (I_as) 122 is not greater than a positive current threshold 505, then the current measurement and fault detection module 301 does not change the fault counter and method 400 proceeds to step 490, where the current measurement and fault detection module 301 determines that the inverter sub-module 115 is operating normally. By contrast, when the current measurement and fault detection module 301 determines that the amplitude value of the three-phase stator current (I_as) 122 is greater than a positive current threshold 505, then the method proceeds to step 470 where the current measurement and fault detection module 301 resets a positive counter (Ias_cnt_Pos) that counts a number of consecutive times the amplitude value of the three-phase stator current (I_as) 122 is determined to be less than a positive current threshold (Ithresh) 505. As such, the positive counter (Ias_cnt_Pos) is reset only when the amplitude value of the three-phase stator current (I_as) 122 is greater than the positive current threshold (Ithresh) 505.

When the current measurement and fault detection module 301 determines that the phase angle ($\theta_{phase}$) of the three-phase stator current command signal (I_as*) is not within the negative sector (Bneg) 635 or the negative sector (Cneg) 620 (at step 460), then this means that the angle of the three-phase stator current (I_as) 122 is within the positive sector (Apos) 610, and the method 400 proceeds to step 475, where the current measurement and fault detection module 301 determines whether the amplitude value of the three-phase stator current (I_as) 122 is less than the positive current threshold (Ithresh) 505.

When the current measurement and fault detection module 301 determines that the amplitude value of the three-phase stator current (I_as) 122 is greater than the positive current threshold (Ithresh) 505, then the method proceeds to step 470 where the current measurement and fault detection module 301 resets a positive counter (Ias_cnt_Pos).

When the current measurement and fault detection module 301 determines that the amplitude value of the three-phase stator current (I_as) 122 is less than the positive current threshold (Ithresh) 505, then the method 400 proceeds to step 480 where the current measurement and fault detection module 301 increments the positive counter (Ias_cnt_Pos) and the method proceeds to step 485. At step 485, the current measurement and fault detection module 301 determines whether a present value of the positive counter (Ias_cnt_Pos) is greater than a maximum count (MaxCnt) value.

When the current measurement and fault detection module 301 determines that the present value of the positive counter (Ias_cnt_Pos) is less than the maximum count (MaxCnt) value, then the method 400 proceeds to step 490, where the current measurement and fault detection module 301 determines that the inverter sub-module 115 is operating normally.

By contrast, when the current measurement and fault detection module 301 determines that the present value of the positive counter (Ias_cnt_Pos) is greater than a maximum count (MaxCnt) value, then the method 400 proceeds to step 495, where the current measurement and fault detection module 301 determines that the inverter sub-module 115 is operating abnormally. For instance, in one scenario, the inverter sub-module 115 is operates abnormally if there is fault due to switch 182 that generates the positive portion of the three-phase stator current (I_as) 122 (e.g., switch 182 is not generating a current or is not connected properly).

Some of the embodiments and implementations are described above in terms of functional and/or logical block components and various processing steps. However, it should be appreciated that such block components may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

In this document, relational terms such as first and second, and the like may be used solely to distinguish one entity or action from another entity or action without necessarily requiring or implying any actual such relationship or order between such entities or actions. Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for determining whether a first inverter sub-module of an inverter module is operating normally, the method comprising the steps of:
   defining a plurality of sectors of a first current command signal based on a phase angle of the first current command signal, the plurality of sectors including a first positive sector in which an amplitude of the first current command signal has positive values, and a first negative sector in which the amplitude of the first current command signal has negative values;
   maintaining a present value at a positive counter that counts a number of consecutive times the amplitude of a first current signal is determined to be less than the positive current threshold when the phase angle of the first current command signal is within the first positive sector;
   regularly measuring an amplitude of the first current signal; and after each measurement:
   determining, whether a present value maintained by the positive counter exceeds a first maximum count;
   determining that the first inverter sub-module is operating abnormally when the present value maintained by the positive counter exceeds the first maximum count; and
   determining that the first inverter sub-module is operating abnormally when the present value maintained by the positive counter is less than the first maximum count.

2. A method according to claim 1, further comprising the steps of:
   maintaining a present value at a negative counter that counts a number of consecutive times the amplitude of the first current signal is determined to be greater than a negative current threshold phase angle of the first current command signal is within the first negative sector;
   determining whether a present value of the negative counter is greater than a second maximum count value when the amplitude of the first current signal is greater than a negative current threshold and when the phase angle of the first current command signal is within the first negative sector;
   determining that the first inverter sub-module is operating abnormally when the present value of the negative counter is greater than the second maximum count value; and
   determining that the first inverter sub-module is operating normally when the present value of the negative counter is not greater than the second maximum count value.

3. A method according to claim 1, wherein the first current command signal is a sinusoid waveform having:
   a positive peak amplitude, wherein the first positive sector of the first current command signal is defined as values of the first current command signal within ±30° of the positive peak amplitude, and
   a negative peak amplitude, wherein the first negative sector of the first current command signal is defined as values of the first current command signal within ±30° of the negative peak amplitude.

4. A method for determining whether a first inverter sub-module of an inverter module is operating normally, the method comprising the steps of:
   defining a plurality of sectors of a first current command signal, the plurality of sectors comprising: a plurality of positive sectors in which an amplitude of the first current command signal has positive values; and a plurality of negative sectors in which the amplitude of the first current command signal has negative values;
   (a) determining a phase angle of the first current command signal and an amplitude of a first current signal;
   (b) determining, when the phase angle of the first current command signal is within a first positive sector, whether the amplitude of a first current signal is less than a positive current threshold;
   (c) when the amplitude of the first current signal is less than the positive current threshold, incrementing a positive counter that counts a number of consecutive times the amplitude of the first current signal is determined to be less than the positive current threshold;
   (d) determining whether a present value maintained by the positive counter exceeds a first maximum count; and
   (e) determining that the first inverter sub-module is operating abnormally when the present value maintained by the positive counter exceeds the first maximum count.

5. A method according to claim 4, further comprising the step of:
   (f) determining that the first inverter sub-module is operating normally when the present value maintained by the positive counter is less than the first maximum count.

6. A method according to claim 4, wherein the plurality of negative sectors further comprise a first negative sector, a second negative sector and a third negative sector, wherein the plurality of positive sectors further comprise a second positive sector and a third positive sector, and wherein the step of (b) determining, when the phase angle of the first current command signal is within the first positive sector, whether the amplitude of a first current signal is less than a positive current threshold, further comprises the steps of:
   (b1) determining whether the phase angle of the first current command signal is within the first negative sector, the second positive sector or the third positive sector;
   (b2) when the phase angle of the first current command signal is not within the first negative sector, the second positive sector or the third positive sector, determining whether the phase angle of the first current command signal is within the second negative sector or the third negative sector; and
   (b3) when the phase angle of the first current command signal is not within the second negative sector or the third negative sector, determining that the phase angle of the first current command signal is within the first positive sector and determining whether the amplitude of the first current signal is less than a positive current threshold.

7. A method according to claim 6, wherein when phase angle of the first current command signal is within the second negative sector or the third negative sector, further comprising the steps of:
   determining whether the amplitude of the first current signal is greater than the positive current threshold; and
   when the amplitude of the first current signal is greater than the positive current threshold, resetting the positive counter that counts a number of consecutive times the amplitude of the first current signal is determined to be greater than the positive current threshold.

8. A method according to claim 6, wherein when the phase angle of the first current signal is within the first positive sector and the amplitude of the first current signal is greater than the positive current threshold, further comprising the steps of:
   resetting the positive counter.

9. A method according to claim 6, wherein the step of (b1) determining whether the phase angle of the first current command signal is within the first negative sector, the second positive sector or the third positive sector, further comprises the steps of:

(b11) determining whether the phase angle of the first current command signal is within the second negative sector or the third negative sector; and (b12) determining, when the phase angle of the first current command signal is not within the second negative sector or the third negative sector, whether the phase angle of the first current command signal is within the first negative sector.

10. A method according to claim 9, wherein when the phase angle of the first current command signal is within the second positive sector or the third positive sector, further comprising the steps of:

(l) determining whether the amplitude of the first current signal is less than a negative current threshold; and (m) resetting, when the amplitude of the first current signal is less than the negative current threshold, a negative counter that counts a number of consecutive times the amplitude of the first current signal is determined to be less than the negative current threshold.

11. A method according to claim 9, when the phase angle of the first current command signal is within the first negative sector, further comprising the steps of:

(g) determining whether the amplitude of the first current signal is greater than the negative current threshold;

(h) incrementing the negative counter when the amplitude of the first current signal is greater than the negative current threshold;

(i) determining whether a present value of the negative counter is greater than a second maximum count value; and (j) determining, when the present value of the negative counter is greater than the second maximum count value, that the first inverter sub-module is operating abnormally.

12. A method according to claim 11, when the present value of the negative counter is not greater than the second maximum count value, further comprising the step of:

(k) determining that the first inverter sub-module is operating normally.

13. A method according to claim 11, when phase angle of the first current command signal is within the first negative sector and when the amplitude of the first current signal is not greater than the negative current threshold, further comprising the step of:

(m) resetting the negative counter.

14. A method according to claim 1, wherein the first current command signal is a sinusoid waveform having:

a positive peak amplitude, wherein the first positive sector of the first current command signal is defined as values of the first current command signal within ±30° of the positive peak amplitude, and a negative peak amplitude, wherein the first negative sector of the first current command signal is defined as values of the first current command signal within ±30° of the negative peak amplitude.

15. A method for determining whether a first inverter sub-module of an inverter module is operating normally, the method comprising the steps of:

defining a plurality of sectors of a first current command signal, the plurality of sectors comprising: a plurality of positive sectors in which an amplitude of the first current command signal has positive values, and a plurality of negative sectors in which the amplitude of the first current command signal has negative values;

regularly computing a phase angle of the first current command signal, and measuring an amplitude of a first current signal generated by the first inverter sub-module; and after each measurement and computation:

determining whether the amplitude of the first current signal is less than a positive current threshold when the phase angle of the first current command signal is within a first positive sector;

incrementing a count of a positive counter that counts a number of consecutive times the amplitude of the first current signal is determined to be less than the positive current threshold; and determining that the first inverter sub-module is operating abnormally when a present value maintained by the positive counter exceeds a first maximum count, and that the first inverter sub-module is operating normally when the present value maintained by the positive counter is less than the first maximum count.

16. A method according to claim 15, wherein the plurality of negative sectors further comprise a first negative sector, a second negative sector and a third negative sector, wherein the plurality of positive sectors further comprise a second positive sector and a third positive sector, and further comprising the steps of:

determining, when the phase angle of the first current command signal is not within the first negative sector, the second positive sector or the third positive sector, whether the phase angle of the first current command signal is within the second negative sector or the third negative sector; and determining that the phase angle of the first current command signal is within the first positive sector when the phase angle of the first current command signal is not within the second negative sector or the third negative sector, and then determining whether the amplitude of the first current signal is less than a positive current threshold.

17. A method according to claim 16, further comprising the steps of:

determining whether the amplitude of the first current signal is greater than the positive current threshold when phase angle of the first current command signal is within the second negative sector or the third negative sector; and resetting the positive counter when the phase angle of the first current signal is within the first positive sector and the amplitude of the first current signal is greater than the positive current threshold.

18. A method according to claim 17, further comprising the steps of:

determining whether the phase angle of the first current command signal is within the second negative sector or the third negative sector; and determining, when the phase angle of the first current command signal is not within the second negative sector or the third negative sector, whether the phase angle of the first current command signal is within the first negative sector.

19. A method according to claim 18, further comprising the steps of:

maintaining a count of a negative counter that counts a number of consecutive times the amplitude of the first current signal is determined to be less than the negative current threshold each time the amplitude of the first current signal is determined to be less than the negative current threshold;

determining whether the amplitude of the first current signal is less than a negative current threshold when the phase angle of the first current command signal is within the second positive sector or the third positive sector; and resetting the negative counter when the amplitude of the first current signal is less than the negative current threshold.

20. A method according to claim 19, further comprising the steps of:

after each measurement and computation:

determining, when the phase angle of the first current command signal is within the first negative sector, whether the amplitude of the first current signal is greater than the negative current threshold;

incrementing the negative counter when the amplitude of the first current signal is greater than the negative current threshold;

resetting the negative counter when phase angle of the first current command signal is within the first negative sector and when the amplitude of the first current signal is not greater than the negative current threshold;

determining that the first inverter sub-module is operating abnormally when a present value of the negative counter is greater than a second maximum count value; and determining that the first inverter sub-module is operating normally when the present value of the negative counter is not greater than the second maximum count value.

21. A method according to claim 20, wherein the first current command signal is a sinusoid waveform having:

a positive peak amplitude, wherein the first positive sector of the first current command signal is defined as values of the first current command signal within ±30° of the positive peak amplitude, and a negative peak amplitude, wherein the first negative sector of the first current command signal is defined as values of the first current command signal within ±30° of the negative peak amplitude.

* * * * *